(12) United States Patent
Venkatramani et al.

(10) Patent No.: US 11,960,813 B2
(45) Date of Patent: Apr. 16, 2024

(54) AUTOMATIC REDISTRIBUTION LAYER VIA GENERATION

(71) Applicants: Advanced Micro Devices, Inc., Santa Clara, CA (US); ATI Technologies ULC, Markham (CA)

(72) Inventors: Rajagopalan Venkatramani, Hsinchu (TW); Renato Dimatula Gaddi, Markham (CA); Liane Martinez, Markham (CA); Warren Alexander Santos, Markham (CA); Dennis Glenn Lozanta Surell, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 17/562,833

(22) Filed: Dec. 27, 2021

(65) Prior Publication Data

US 2023/0036608 A1    Feb. 2, 2023

Related U.S. Application Data

(60) Provisional application No. 63/228,552, filed on Aug. 2, 2021.

(51) Int. Cl.
*G06F 30/3953* (2020.01)
*G06F 30/398* (2020.01)

(52) U.S. Cl.
CPC ........ *G06F 30/3953* (2020.01); *G06F 30/398* (2020.01)

(58) Field of Classification Search
CPC .................................................. G06F 30/3953
(Continued)

(56) References Cited

U.S. PATENT DOCUMENTS

| 5,798,937 A | 8/1998 | Bracha et al. |
| 7,302,662 B2 | 11/2007 | Lee et al. |

(Continued)

FOREIGN PATENT DOCUMENTS

| EP | 1742266 A2 | 1/2007 |
| KR | 20170096103 A | 8/2017 |

OTHER PUBLICATIONS

International Search Report and Written Opinion in International Application No. PCT/US2022/037897, dated Nov. 22, 2022, 13 pages.

(Continued)

*Primary Examiner* — Eric D Lee
(74) *Attorney, Agent, or Firm* — Kowert, Hood, Munyon, Rankin & Goetzel, P.C.; Rory D. Rankin

(57) ABSTRACT

A system and method for automatically generating placement of vias within redistribution layers of a semiconductor package are described. In various implementations, a user defines attributes to use for automatic via generation in redistribution layers of a semiconductor package. The circuitry of a processor of a computing device used by the user executes instructions of an automatic redistribution layer (RDL) via generator. The automatic via generator uses the attributes, data indicative of the RDL netlist of signal routes within the RDL, and RDL mask layout data representing the signal masks of the metal layers within the RDL. The processor generates placement of vias for in the RDL based on the attributes and an identification of overlapping regions between metal layers.

20 Claims, 9 Drawing Sheets

(58) Field of Classification Search
USPC .......................................................... 716/130
See application file for complete search history.

(56) References Cited

U.S. PATENT DOCUMENTS

| | | | |
|---|---|---|---|
| 9,319,254 | B2 | 4/2016 | Haq |
| 9,450,780 | B2 | 9/2016 | Wang et al. |
| 9,589,092 | B2 | 3/2017 | Fang et al. |
| 10,740,163 | B2 | 8/2020 | Hamidouche et al. |
| 2004/0255258 | A1* | 12/2004 | Li .......................... G06F 30/39 716/122 |
| 2014/0029617 | A1 | 1/2014 | Wang et al. |
| 2014/0037027 | A1 | 2/2014 | Haq |
| 2017/0180272 | A1 | 6/2017 | Bernath |
| 2018/0004693 | A1 | 1/2018 | Macnamara et al. |
| 2018/0107627 | A1 | 4/2018 | LeBeane et al. |
| 2019/0103386 | A1* | 4/2019 | Chen ..................... H01L 21/568 |
| 2020/0105671 | A1 | 4/2020 | Lai et al. |
| 2021/0082815 | A1 | 3/2021 | Doornbos |
| 2022/0084561 | A1 | 3/2022 | Chen et al. |
| 2022/0208678 | A1 | 6/2022 | Schultz |

OTHER PUBLICATIONS

Healy et al., "Distributed TSV Topology for 3-D Power-Supply Networks", IEEE Transactions on Very Large Scale Integration (VLSI) Systems, Nov. 1, 2012, pp. 2066-2069, vol. 20, No. 11.

International Search Report and Written Opinion in International Application No. PCT/US2022/037903, dated Nov. 24, 2022, 14 pages.

Fang et al., "IR to routing challenge and solution for interposer-based design", The 20th Asia and South Pacific Design Automation Conference, Jan. 19, 2015, pp. 226-229.

Kabir et al., Coupling Extraction and Optimization for Heterogeneous 2.5D Chiplet-Package Co-Design, 2020 IEEE/ACM International Conference On Computer Aided Design (ICCAD), Nov. 2, 2020, pp. 1-8.

First Examination Report in Indian Patent Application No. 202017057516, dated Jan. 4, 2022, 6 pages.

Communication pursuant to Article 94(3) EPC in European Patent Application No. 19734943.4, dated May 10, 2022, 6 pages.

Office Action in Korean Patent Application No. 10-2020-7037837, dated Aug. 10, 2022, 14 pages.

Notice of Allowance in Korean Patent Application No. 10-2020-7037837, dated Feb. 27, 2023, 4 pages.

Butanthavibul et al., U.S. Appl. No. 18/047,482, entitled "Backside Power With on-Die Power Switches", filed Oct. 18, 2022, 42 pages.

Gysi et al., "dCUDA: Hardware Supported Overlap of Computation and Communication", Proceedings of the International Conference for High Performance Computing, Networking, Storage and Analysis, Nov. 13-18, 2016, 12 pages.

International Search Report and Written Opinion in International Application No. PCT/US2019/029040, dated Sep. 4, 2019, 12 pages.

Kim et al., "GPUnet: Networking Abstractions for GPU Programs", Proceedings of the 11th USENIX conference on Operating Systems Design and Implementation, Oct. 6, 2014, pp. 201-216, vol. 34, Issue 3.

Oden et al., "InfiniBand Verbs on GPU: a case study of controlling an InfiniBand network device from the GPU", International Parallel & Distributed Processing Symposium Workshops, May 19-23, 2014, 8 pages.

Orr et al., "Gravel: Fine-Grain GPU-Initiated Network Messages", International Conference for High Performance Computing, Networking, Storage and Analysis, Nov. 2017, 12 pages.

Rossetti, Davide, "GPUdirect: Integrating the GPU With a Network Interface", GPU Technology Conference, 2015, 18 pages, NVIDIA, http://on-demand.gputechconf.com/gtc/2015/presentation/S5412-Davide-Rossetti.pdf. [Retrieved Jun. 16, 2018].

Venkatramani et al., U.S. Appl. No. 17/564,725, entitled "Automated Redistribution Layer Power Connections", filed Dec. 29, 2021, 46 pages.

International Search Report and Written Opinion in International Application No. PCT/US2023/074884, mailed Jan. 3, 2024, 12 pages.

* cited by examiner

AUTOMATIC REDISTRIBUTION LAYER VIA GENERATION

CROSS REFERENCE TO RELATED APPLICATIONS

This application claims priority to Provisional Patent Application Ser. No. 63/228,552, entitled "VIA GENERATION FOR SILICON LAYOUT" filed Aug. 2, 2021, the entirety of which is incorporated herein by reference.

BACKGROUND

Description of the Relevant Art

There is a growing demand for semiconductor packages that provide communication between one or more integrated circuits in a chip package and external components on a motherboard located externally from the chip package. Electronic products associated with mobile computing, wearable electronics, and the Internet of Things (IoT) drive the demand for small packages that utilize vertical signal interconnections. Examples of the chip packages used in these products include ball grid arrays (BGAs), chip scale packages (CSPs), and System in Packages (SiPs).

The semiconductor package utilizes controlled collapse chip connection (C4) interconnections, which is also referred to as flip-chip interconnection. For example, C4 bumps are connected to vertical through silicon vias (TSVs) formed in a silicon package substrate that has connections to the printed circuit board using bump pads. Groups of TSVs forming through silicon buses are used as interconnects between a base die, one or more additional integrated circuits, and routing on a printed circuit board (PCB) such as a motherboard or a card. The demand for SiPs and more signal interconnects between the integrated circuits and the printed circuit board (PCB) also increases the demand for package substrates and interposers.

The package substrate is a part of the chip package that provides mechanical base support as well as provides an electrical interface for the signal interconnects. An interposer is an intermediate layer between the one or more integrated circuits and either flip chip bumps or other interconnects and the package substrate. When used, the interposer provides the electrical interface for the signal interconnects between the die assembled on it (die-to-die interconnects) and the package substrate (die-to-package interconnects). Depending on the implementation, the terms package substrate and interposer are used interchangeably.

The one or more integrated circuits within the semiconductor package have signal routes connected between them and the motherboard (or printed circuit board) using redistribution layers. The signal routes of the redistribution layers are signal routes located between the micro-bumps that make contact with pads on the integrated circuit and through silicon vias (TSVs) of a silicon package substrate.

Although innovations provide improvements, design issues still arise with modern techniques in processing and integrated circuit design that limit potential benefits. One issue is the one or more integrated circuits have tens of thousands of nodes for receiving one or more power supply voltage reference levels and one or more ground reference voltage levels while there are hundreds of nodes for transferring these voltage reference levels at the TSVs. The routing of these power connections through the redistribution layers becomes complex. Additionally, manually placing vias on the mask layout representation of these signal routes before performing verification checks and later fabrication takes weeks or months.

In view of the above, efficient methods and systems for generating vias of power connections within the redistribution layers are desired.

Figure 1:
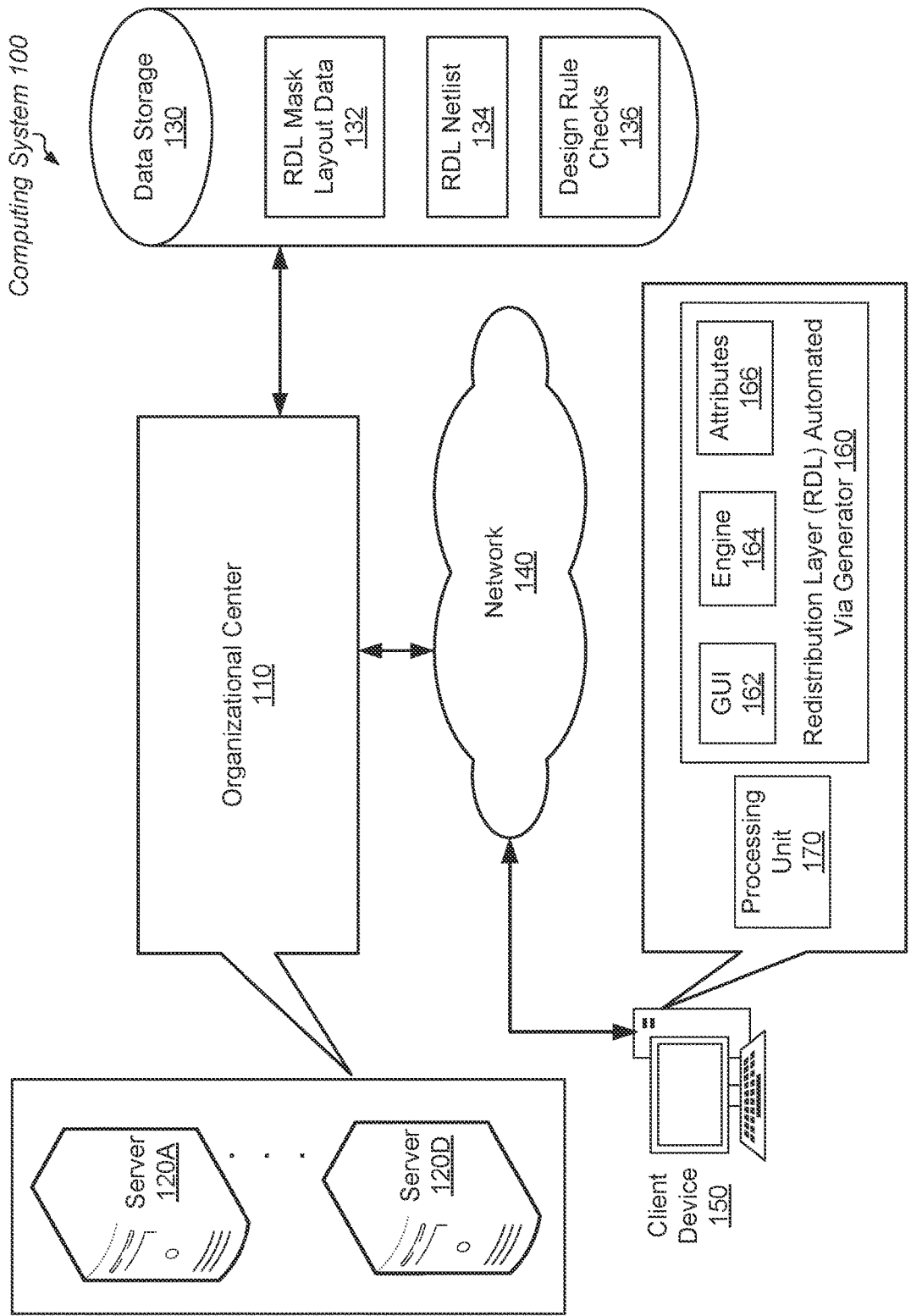
FIG. 1 is a generalized diagram of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for automatically generating vias within redistribution layers are contemplated. As used herein, the term "automatic generation" or "automatically generating" refers to having the ability to perform generation, or perform generating steps, without user intervention. As disclosed herein, a user defines attributes to use for automatic via generation in redistribution layers of a semiconductor package. In one implementation, the user provides the attributes through a graphical user interface (GUI). In another implementation, the user provides the attributes through a text file or an executable file written in one of a variety of scripting languages. A computing device used by the user includes hardware, such as circuitry of a processor, to execute instructions of an automatic via generator. The automatic via generator uses the attributes, a copy of a redistribution layer (RDL) netlist of the signal routes within the RDL, and a copy of the RDL mask layout data representing the signal masks of the metal layers within the RDL.

When the processor of the computing device executes the instructions of the automatic via generator, the processor identifies metal overlap regions between metal layers of the RDL. The metal overlap regions are also referred to as metal overlap junction areas, or overlap junction areas. In some implementations, the metal overlap regions are between adjacent metal layers of the RDL such as the metal layers RDL1 and RDL2. In other implementations, the metal overlap regions are between two non-adjacent metal layers of the RDL such as the metal layers RDL1 and RDL4 such as a through hole via. In yet other implementations, the metal overlap regions are between a pin of the surface mount device (SMD) pin layer and a metal layer of the RDL. In yet further implementations, the metal overlap regions are between a metal layer of the RDL and an under-bump metallurgy (UBM) layer providing electrical connection to a C4 bump. In some examples, the metal overlap regions have a square or rectangular shape such as a metal overlap region between two metal layers of the RDL. In other examples, the metal overlap regions have a circular shape such as a metal overlap region between a metal layer of the RDL and a pin of the SMD pin layer. For valid via generation, the metal overlap region between two metal layers is equal to or greater than a minimum overlap junction area threshold. In some implementations, based on received attributes, the processor divides an overlap region in half to allow via layers to be placed both above and below the overlap region. Based on attributes received from the user, the processor places via layers of different types in the overlap region.

The processor generates the vias based on a sequence order indicated in the received attributes. The sequence order determines which via layer to use to initiate the automatic via generation and each subsequent via layer to select for further automatic via generation. The vias are placed based on the size and pitch corresponding to the currently selected via layer so as to satisfy DRC rules. In addition, the processor does not change the dimensions of the metal layers of signal routes during via placement. If multiple sequences for certain via layers are specified in the received attributes, the processor places additional vias in the via layers where possible. Although in some cases via redundancy already exists, the automatic via generator still increases the via count where possible. Afterward, the processor generates a report. The processor maintains a log file during the automatic via generation and uses the corresponding information to provide summarized results in the report. In various implementations, the processor writes a file located in a known destination.

Figure 2:
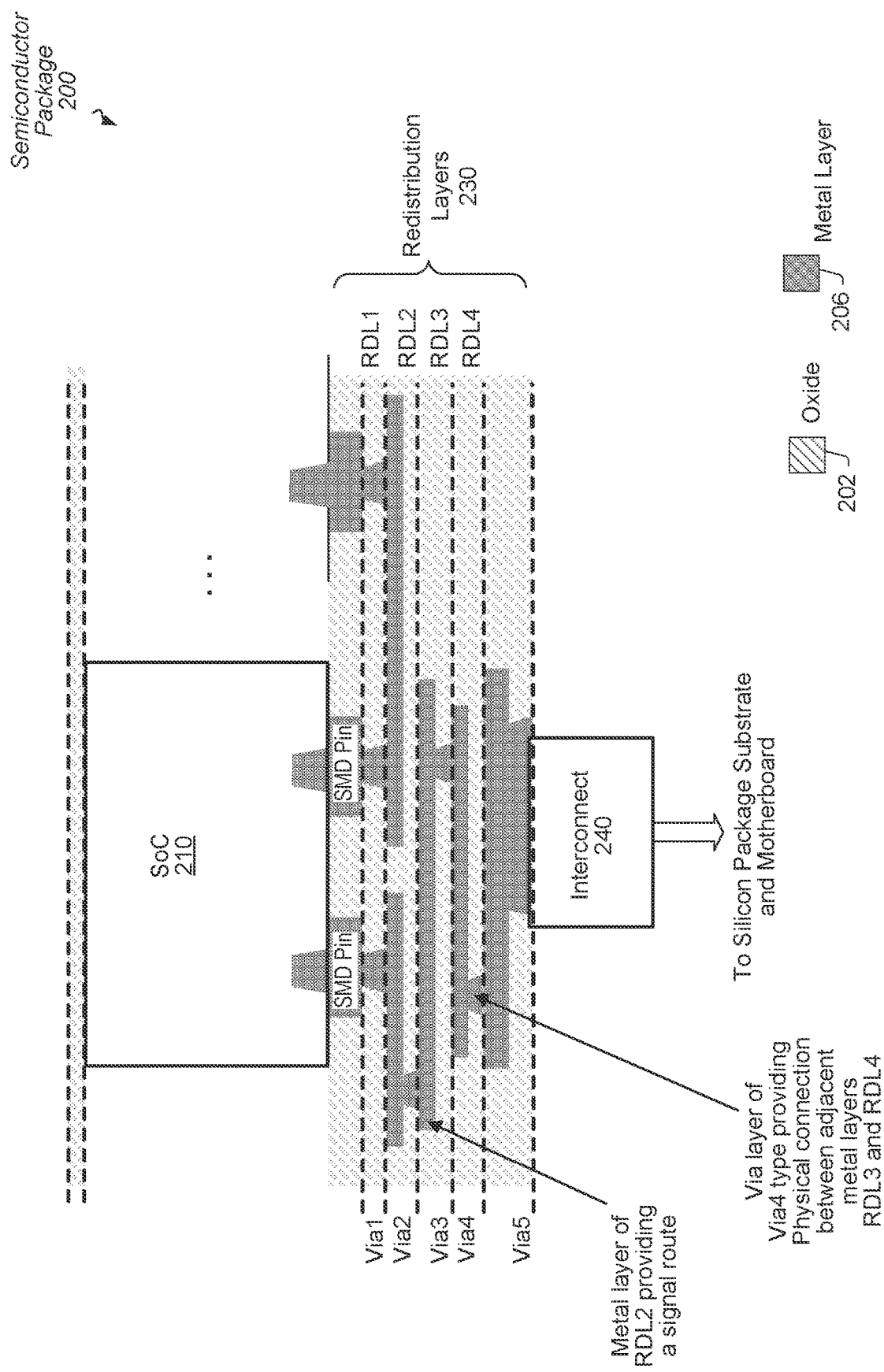
FIG. 2 is a generalized diagram of a cross-sectional view of a semiconductor package metal layer scheme.
Figure 3:
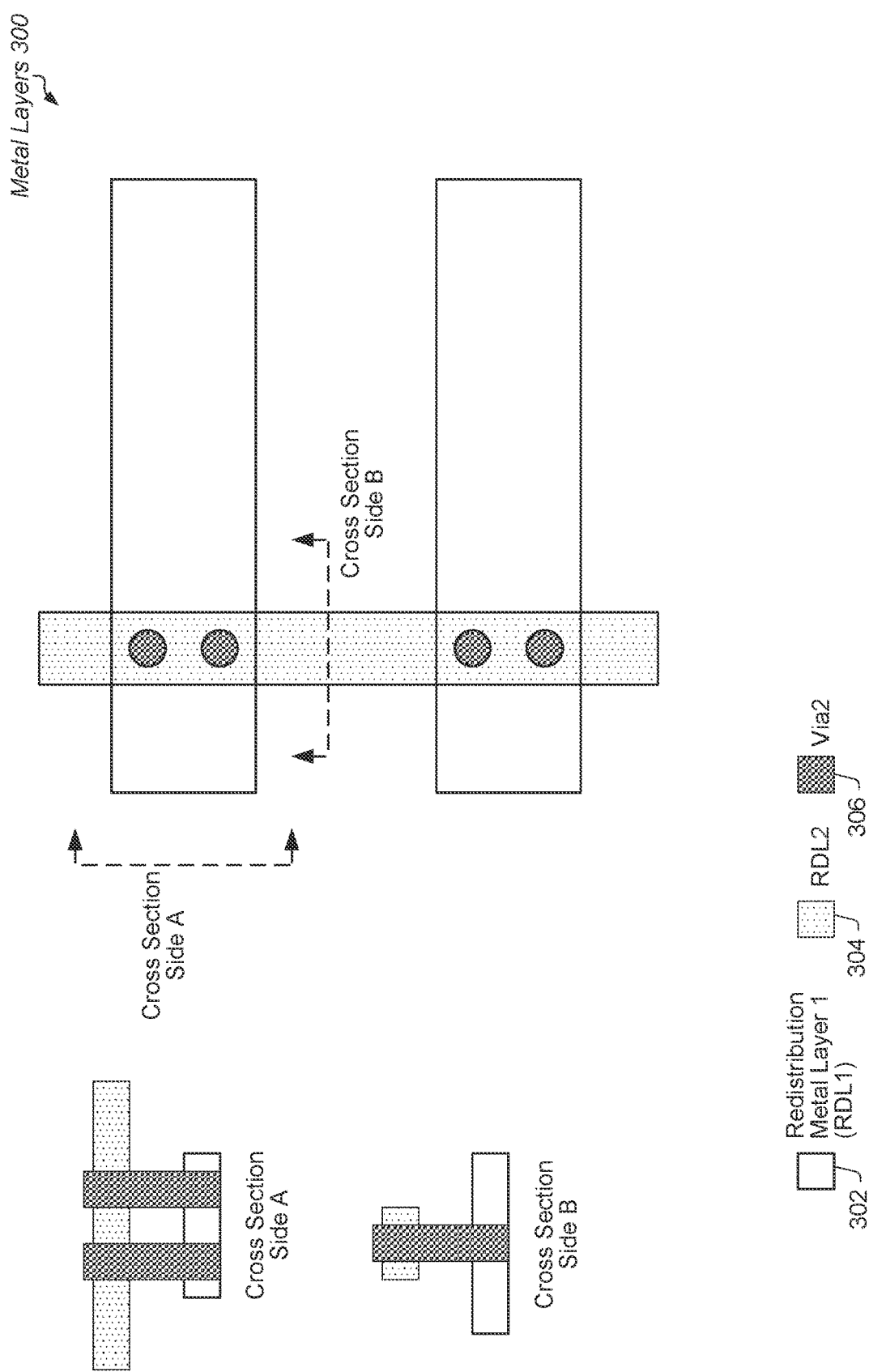
FIG. 3 is a generalized diagram of metal layers of redistribution layers.
Figure 4:
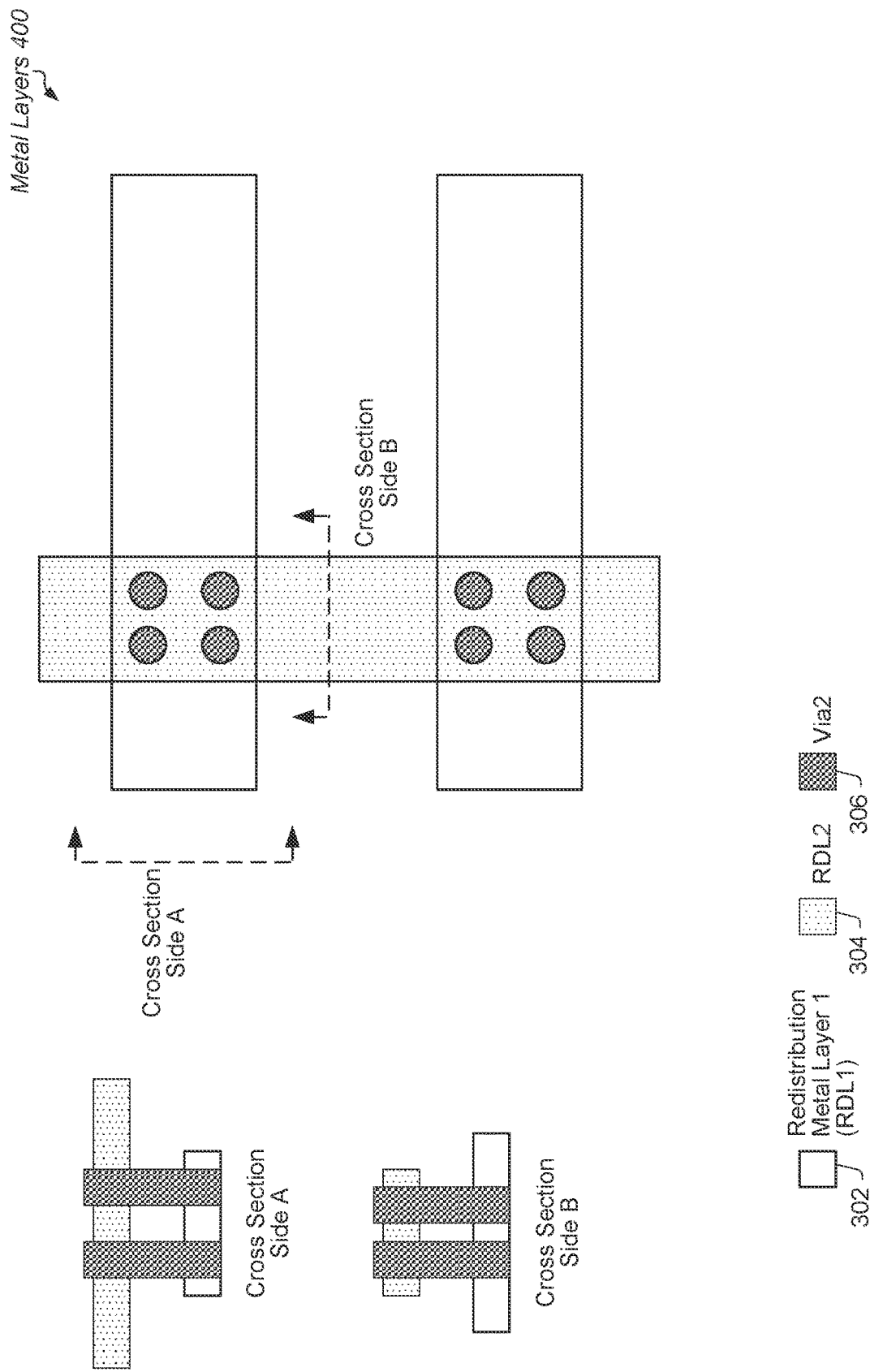
FIG. 4 is a generalized diagram of metal layers of redistribution layers.
Figure 5:
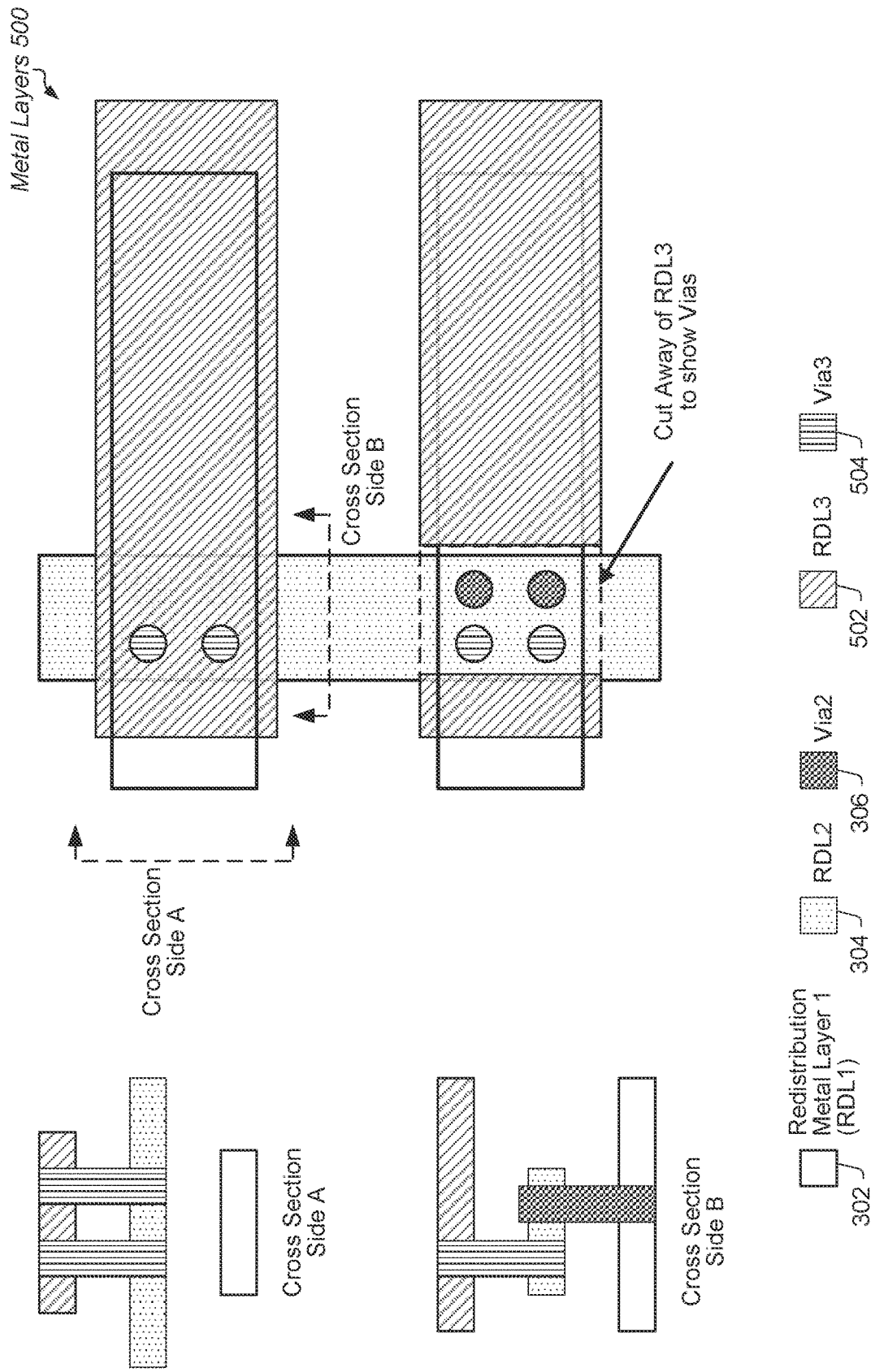
FIG. 5 is a generalized diagram of metal layers of redistribution layers.
Figure 6:
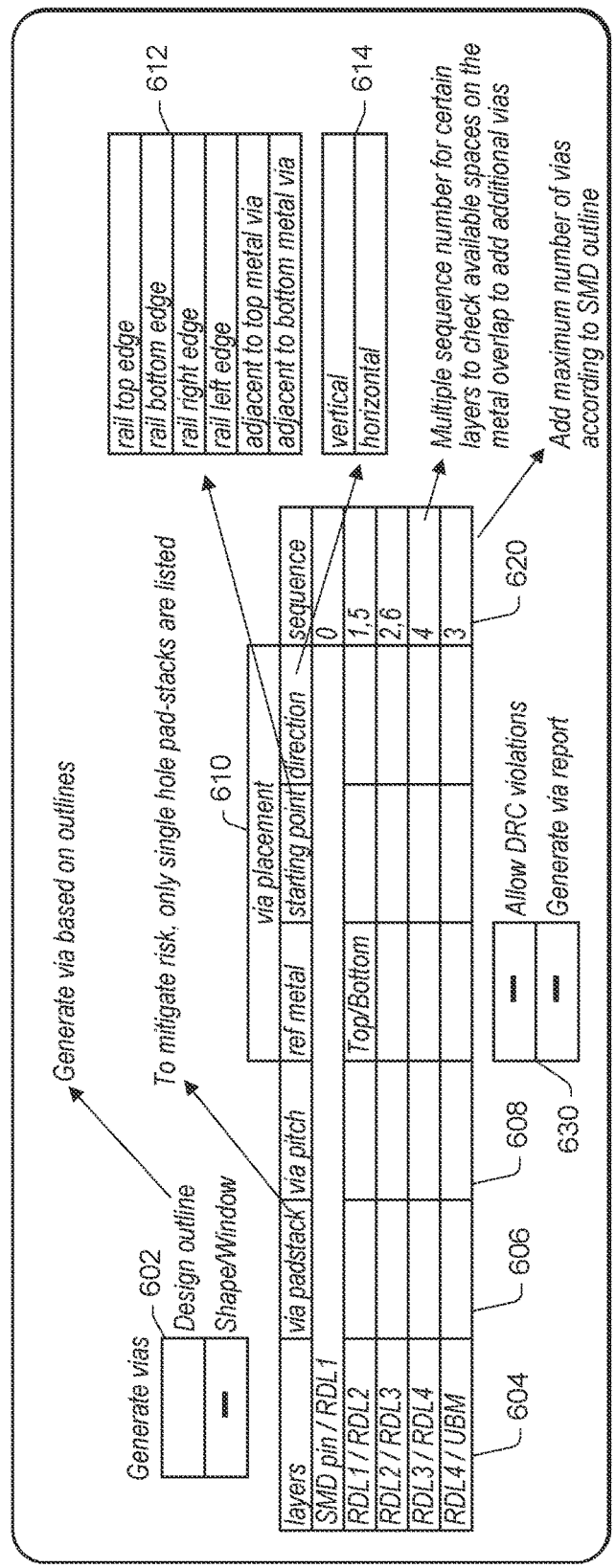
FIG. 6 is a generalized diagram of a graphical user interface.
Figure 7:
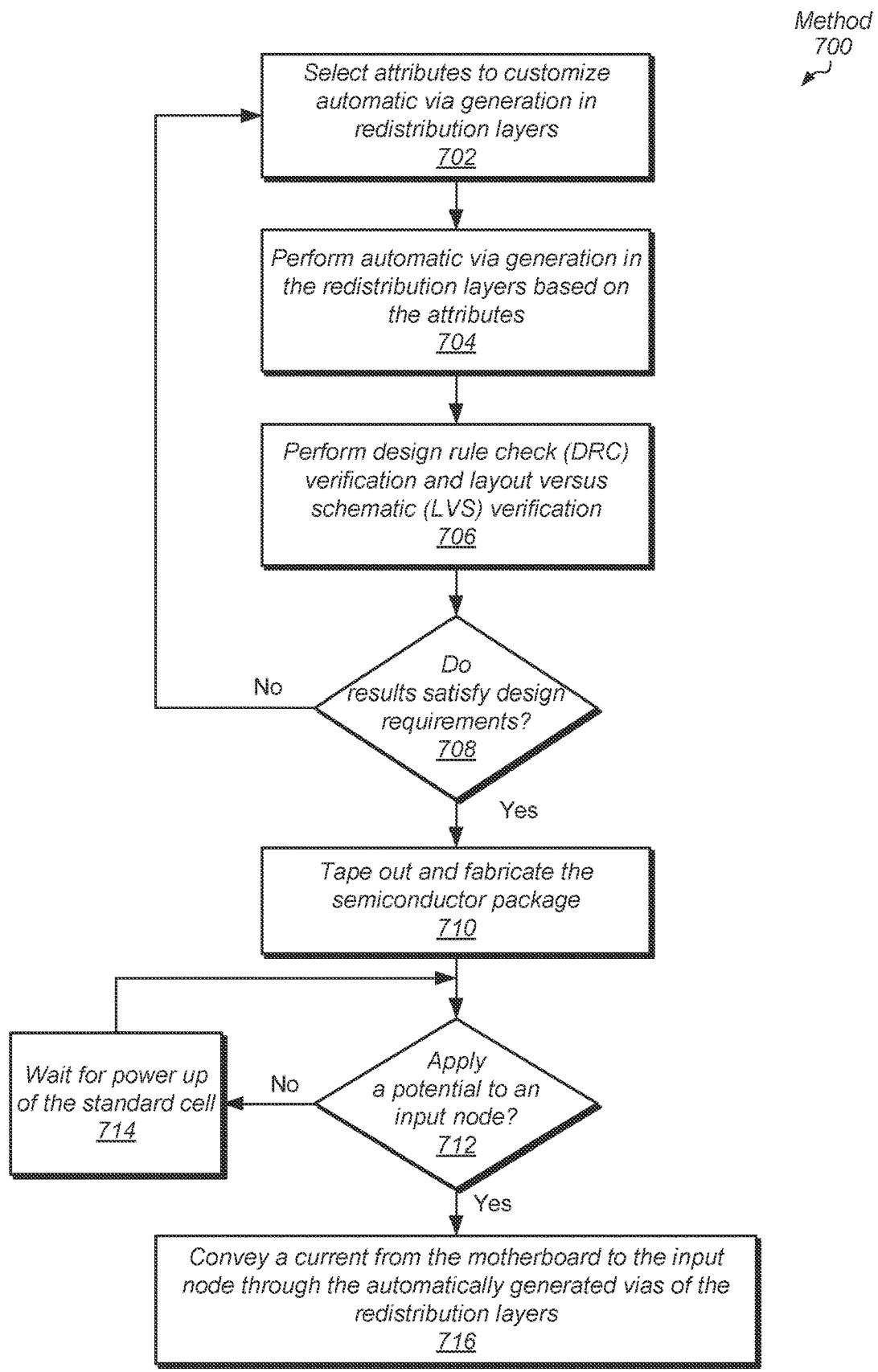
FIG. 7 is a generalized diagram of one embodiment of a method for automatic via generation in redistribution layers.
Figure 8:
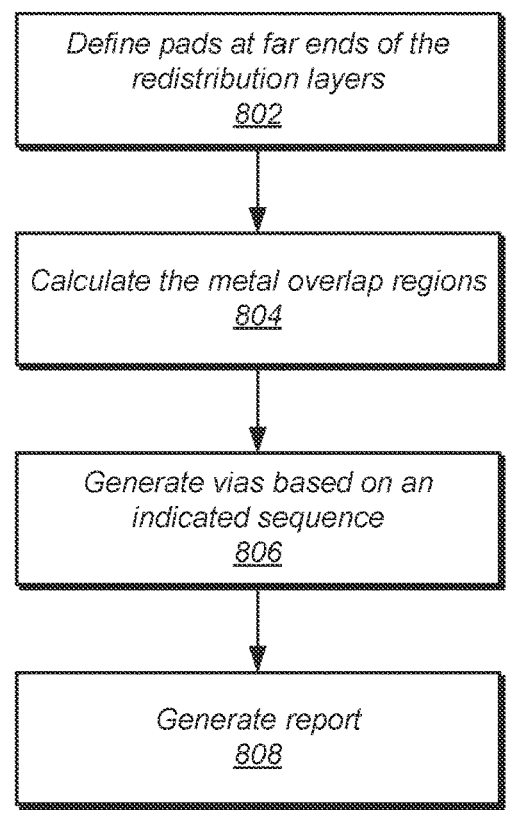
FIG. 8 is a generalized diagram of one embodiment of a method for automatic via generation in redistribution layers.
Figure 9:
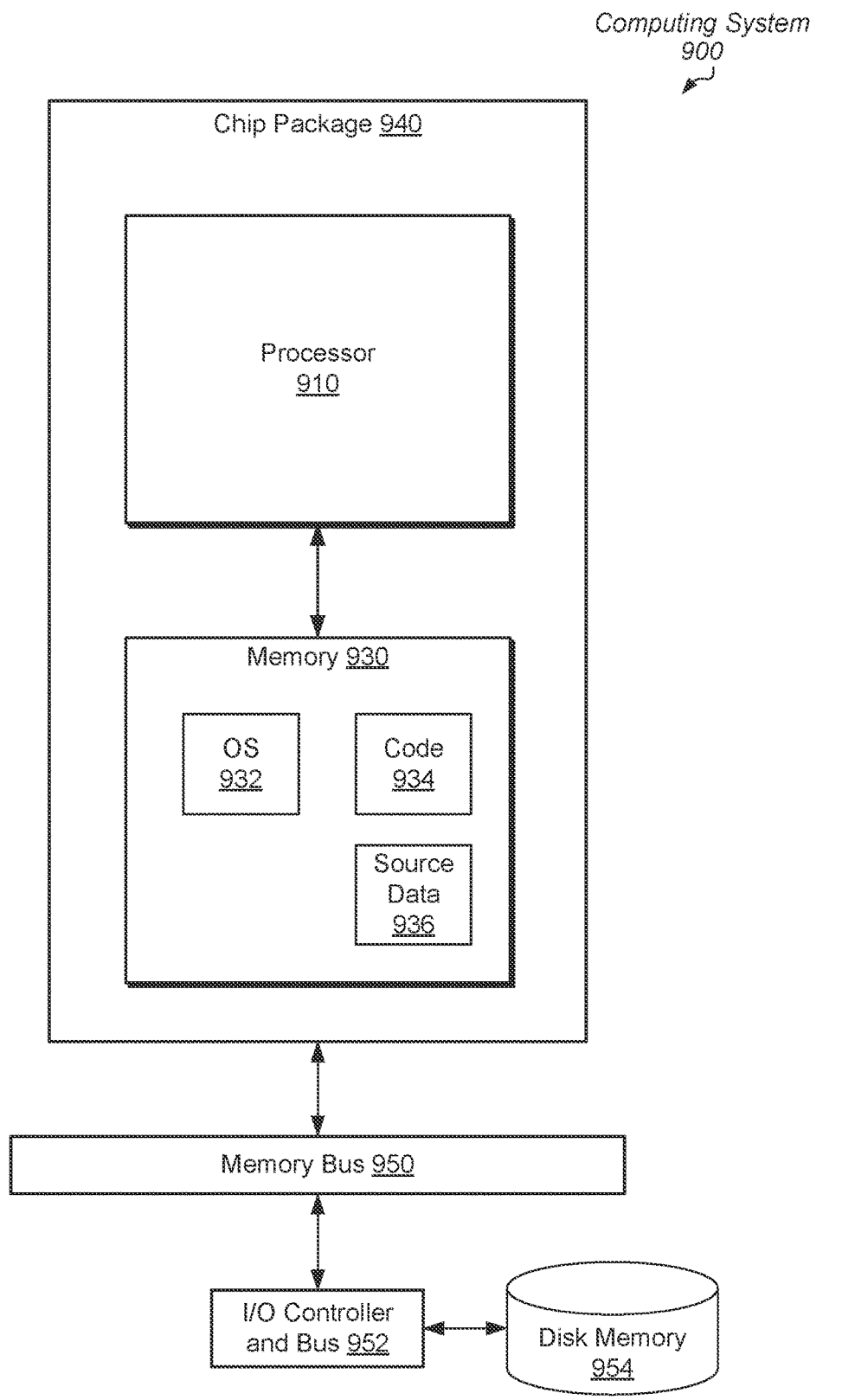
FIG. 9 is a generalized diagram of a computing system.

In the following description, a computing system is shown in FIG. 1 for supporting the development of a hardware product that uses a semiconductor package substrate. The computing system supports the automatic generation of vias in the redistribution layers. FIG. 2 illustrates the components of a semiconductor package, such as the redistribution layers, using flip chip technology. The FIGS. 3-5 illustrate the metal overlap regions between adjacent metal layers of the redistribution layers. An example of a graphical user interface is shown in FIG. 6 for providing attributes from the user to utilize during the automatic generation of vias in the redistribution layers. FIGS. 7-8 provide steps of methods to perform to support the automatic generation of vias in the redistribution layers. An example of a fabricated chip package, which includes the automatically generated vias in the redistribution layers, within a computing system is shown in FIG. 9.

Referring to FIG. 1, a generalized block diagram of one embodiment of a computing system 100 is shown. In the illustrated implementation, the computing system 100 includes the client computing device 150, the servers 120A-120D that include hardware for executing software and supporting the organizational center 110, a network 140, and the data storage 130 that includes one or more data stores supported and used by the organizational center 110. Although a single client computing device 150 is shown, any number of client computing devices utilize the organizational center 110 through the network 140. The client computing device 150, which is also referred to as client device 150, includes hardware, such as circuitry of a processor, to execute instructions of the redistribution layer (RDL) automatic via generator 160. The RDL automatic via generator 160 (or via generator 160) uses a copy of data stored in the data storage 130 and attributes 166 provided by a user. In an implementation, the user provides the attributes 166 through the graphical user interface (GUI) 162. Examples of data used by the via generator 160 are copies of the RDL mask layout data 132, the RDL netlist, and at least a portion of the design rule checks (DRCs) 136.

The client device 150 includes a desktop computer or a mobile computing device such as a laptop, a tablet computer, and so forth. The client device 150 includes hardware circuitry such as a processing unit 170 for processing instructions of computer programs. In some implementations, the processing unit 170 includes one or more homogeneous cores of a processor. In other embodiments, the processing unit includes heterogeneous cores such as a parallel processing architected core and a general-purpose core as used in central processing units (CPUs). The parallel architected core may be a graphics processing unit (GPU), a digital signal processing unit (DSP) or other.

The client device 150 includes a network interface (not shown) supporting one or more communication protocols for data and message transfers through the network 140. The network 140 includes multiple switches, routers, cables, wireless transmitters and the Internet for transferring messages and data. Accordingly, the network interfaces of the organizational center 110 and the client device 150 support at least the Hypertext Transfer Protocol (HTTP) for communication across the World Wide Web. In addition to communicating with the client device 150 through the network 140, the organizational center 110 also communicates with the data storage 130 for storing and retrieving data.

In various implementations, the organizational center 110 is an infrastructure for a vendor producing one or more hardware products. The organizational center 110 includes an intranet network providing a private network accessible only to an organization's staff. An intranet portal is used to provide access to resources with a user-friendly interface such as graphical user interfaces (GUIs) and dashboards. The information and services made available by the organizational center 110 is unavailable to the general public through direct access. Through user authentication, the staff members are able to access resources through the organizational center 110 to communicate with other staff members, collaborate on projects and monitor product development, update products, documents and tools stored in a centralized repository and so forth.

The servers 120A-120D used for supporting the organizational center 110 and resources accessed through the organizational center 110 include a variety of server types such as database servers, computing servers, application servers, file servers, mail servers and so on. In various implementations, the servers 120A-120D and the client device 150 operate with a client-server architectural model.

The client device 150 includes a copy of a particular version of a given software product or tool such as the via generator 160. In some implementations, the version of the via generator 160 is based on at least the operating system and the processor(s) used by the client device 150. The via generator 160 includes an engine 164 that when executed by the processor 170, causes the processor 170 to automatically generate vias in a layout mask representation of signal routes in redistribution layers. The signal routes of the redistribution layers are signal routes located between an integrated circuit and a printed circuit board. For example, the signal routes of the redistribution layers are signal routes located between the micro-bumps that make contact with pads on the integrated circuit and through silicon vias (TSVs) of a silicon package substrate. The redistribution layers make it unnecessary to have a set of input/output (I/O) pads that are wire bonded to pins of the package, which eases chip-to-chip bonding.

As described earlier, the organizational center 110 is an infrastructure for a vendor producing one or more hardware products. The integrated circuit is one of a variety of types of integrated circuits being developed for production. With possibly tens of thousands of metal layers used to provide the signal routes in the redistribution layers, manually placing vias on these metal layers takes weeks or months. The via generator 160 performs this placement in a more efficient manner. Although the redistribution layers include control signal routes and data signal routes, in an implementation, the via generator 160 provides automatic via generation for signal routes of the redistribution layers that provide one of a power supply voltage reference level or a ground reference voltage level used by the integrated circuit. To do so, the via generator 160 uses attributes 166 provided by a user.

In one implementation, the user provides the attributes 166 to the via generator 160 through the graphical user interface (GUI) 162. In another implementation, the user provides the attributes 166 to the via generator 160 through a text file or an executable file written in one of a variety of scripting languages. In an implementation, when the processor 170 executes the code of the engine 164 of the via generator 160, the processor 170 automatically generates vias in an order of sequences specified by the attributes 166. Each sequence identifies a pair of adjacent metal layers in the redistribution layers. The via generator 160 additionally uses copies of the RDL mask layout data 132 and the RDL netlist 134 to identify the placement of the metal layers in the redistribution layers. The via generator 160 also uses the DRCs 136 to verify that the placement of the vias does not violate design rules for layout. The via generator 160 or another tool also performs layout versus schematic (LVS) checks. If the placement of vias pass the DRC and LVS checks, then one or more copies of an updated version of the RDL mask layout data 132 are stored at the client device 150 and the data storage 130. Following, a semiconductor chip tape out process is performed for the integrated circuit being developed, and a semiconductor fabrication process provides hardware of the integrated circuit to test.

Turning to FIG. 2, a generalized block diagram of a semiconductor package metal layer scheme 200 (or metal layer scheme 200) is shown that provides signal routes between an integrated circuit and a printed circuit board. As shown, the metal layer scheme 200 utilizes controlled collapse chip connection (C4) interconnections, which is also referred to as flip-chip interconnection. The two integrated circuits 210 and 212 have signal routes connected between them and the motherboard (or printed circuit board), which is not shown for ease of illustration. An interconnect may be connected to vertical through glass vias formed in a silicon package substrate that has connections to the printed circuit board using bump pads. The signal routes going to and from the integrated circuits 210 and 212 in addition to the signal routes between the motherboard via the interconnect 240 and the integrated circuits 210 and 212 are routed through the redistribution layers 230. In some implementations, the metal layer scheme 200 additionally includes a separate interposer (not shown) between the redistribution layers 230 and interconnect 240 (e.g., under-bump metallurgy). In an implementation, the interposer includes through silicon vias, whereas, the redistribution layers 230 do not include TSVs. In another implementation, each of the interposer and the redistribution layers 230 include one or more TSVs. In yet another implementation, no separate interposer is used as shown in FIG. 2.

Here, the integrated circuit is a system on a chip (SoC). As shown, one SOC is used in the hardware product. However, other examples of integrated circuits are possible and contemplated such as one or more of a CPU, a GPU, a multimedia engine, an application specific integrated circuit (ASIC), a digital signa processor (DSP), and so forth. The interconnect 240 provides a connection between the multiple redistribution layers (RDLs) 1 to 4 and the package substrate and motherboard. In some implementations, it is common to have a few hundred UBM layers and C4 bumps. Additionally, although four metal layers (RDLs 1-4) are used in redistribution layers 230, in other implementations a different number of metal layers is used. Between adjacent metal layers (RDLs 1-4) of the redistribution layers 230 are the vias of the layers labeled Via2 to Via4, which provide physical connection between adjacent layers of the redistribution layers 230. The redistribution layers 230 also include vias of the Via1 layer between the pins of the SMD pin layer and the metal layer RDL1. As shown, the redistribution layers 230 further include vias of the Via5 layer between the metal layer RDL4 and the interconnect 240.

The SoC 210 may have signals routed both to and from other SOCs (not shown) and the motherboard (printed circuit board) through at least the interconnect 240. The signals are routed through the metal layers of the redistribution layers 230 such as the metal layer designated as redistribution layer 1 (RDL1) and the metal layer designated as redistribution layer 4 (RDL4). These metal layers are also referred to as conductor 1 and conductor 4, respectively. In addition to the metal layers RDL1 to RDL4 of the redistribution layers 230, the signals are also routed through the pins of the surface mount device (SMD) Pin layer, and the via layers Via1 to Via5. Although the redistribution layers 230 include control signal routes and data signal routes, here, the signal routes shown distribute one or more of a power supply voltage reference level and a ground reference voltage level used by the SoC 210 and the SoC 212. Each of the SoC 210 and the SoC 212 is capable of using one or more power supply voltage reference levels and one or more ground reference voltage levels. In some cases, each of the SoC 210 and the SoC 212 has tens of thousands of nodes using pads 220 for receiving the power supply voltage reference levels and the one or more ground reference voltage levels while there are hundreds of UBMs for transferring these voltage reference levels. The routing of these signals becomes complex. Although, in some cases, the layout mask data for the signal routes within the metal layers RDL1 to RDL4 is already provided, manually placing vias on these metal layers takes weeks or months.

To make via placement more efficient, the circuitry of a processor executes instructions of a software tool that follows an algorithm developed by a software programmer that automatically generates vias based on attributes provided by a user. The tool, which is also referred to as a RDL automatic via generator (or automatic via generator), uses copies of the RDL mask layout data and the RDL netlist to identify the placement of the metal layers in the redistribution layers. The automatic via generator also uses attributes supplied by a user. In various implementation, the automatic via generator takes into account design rule checks (e.g., spacing etc.). In some embodiments, such another tool performs DRC and LVS checks. After passing the checks, a semiconductor chip tape out process is performed for the integrated circuit being developed, and a semiconductor fabrication process provides hardware of the integrated circuit to test.

Referring to FIG. 3, a generalized block diagram of metal layers 300 is shown. As shown, two horizontal signal routes in the metal layer RDL 302 are connected by a vertical signal route in the metal layer RDL2 304. The cross sections of the side A and the side B are also provided to aid viewing the layout in three dimensions. The metal layers of RDL1 302 make a physical connection with the metal layer of RDL2 304 with the placement of vias of the Via2 layer 306. Due to the width of the metal layer of RDL2 304, a single column of 2 vias of the Via2 layer 306 are placed. Therefore, each of the two metal layers RDL1 302 and the metal layer RDL2 304 are physically connected. In various implementations, these metal layers 302 and 304 provide a power supply voltage reference level or a ground reference voltage level used by a corresponding integrated circuit.

Although the orientations are described as horizontal and vertical, it is understood that the semiconductor package can be rotated and the redistribution layers would be rotated. The current orientations are used to describe the relationships between the metal layers and the vias. Here, the metal layer RDL2 304 is placed above the metal layer RDL1 302, so the SoC or other integrated circuit would be placed into the page in this diagram, whereas, the UBM and the silicon package substrate are located out of the page in this diagram. The reverse orientation is possible and contemplated, but for this discussion, the integrated circuit is located into the page.

Referring to FIG. 4, a generalized block diagram of metal layers 400 is shown. Materials and structures previously described are numbered identically. As shown, two horizontal signal routes in the metal layer RDL1 302 are connected by a vertical signal route in the metal layer RDL2 304. The cross sections of the side A and the side B are also provided to aid viewing the layout in three dimensions. The metal layers of RDL1 302 make a physical connection with the metal layer of RDL2 304 with the placement of vias of the Via2 layer 306. Due to the larger width of the metal layer of RDL2 304, two columns of 2 vias of the Via2 layer 306 are placed.

Turning to FIG. 5, a generalized block diagram of metal layers 500 is shown. Materials and structures previously described are numbered identically. As shown, two horizontal signal routes in the metal layer RDL1 302 are connected by a vertical signal route in the metal layer RDL2 304. The cross sections of the side A and the side B are also provided to aid viewing the layout in three dimensions. The metal layers of RDL1 302 make a physical connection with the metal layer of RDL2 304 with the placement of vias of the Via2 layer 306. The cut away of the top metal layer RDL3 502 shows the placement of the single column of 2 vias of the Via2 layer 306. Additionally, two horizontal signal routes in the metal layer RDL3 502 are connected by the same vertical signal route in the metal layer RDL2 304. The metal layer RDL3 502 is located above the metal layer RDL2 304 using the previous orientation for metal layers 300-500 (of FIG. 3 and FIG. 4). Therefore, each of the two metal layers RDL1 302, the single metal layer RDL2 304, and the two metal layers RDL3 502 are physically connected.

In various implementations, these metal layers 302, 304 and 502 provide a power supply voltage reference level or a ground reference voltage level used by a corresponding integrated circuit. The metal layers of RDL3 502 make a physical connection with the metal layer of RDL2 304 with the placement of vias of the Via3 layer 504. Due to the width of the metal layer of RDL2 304 and the area needed for the vias of the Via2 layer 306, a single column of 2 vias of the Via3 layer 504 are used by each of the metal layers of RDL3 502. It is noted that the vias of the Via2 layer 306 and the Via3 layer 504 have physical connections with only two adjacent layers, rather than three adjacent layers. In various implementations, the design rule checks (DRCs) do not allow for physical connections to a third metal layer. Therefore, as shown, the vias of the Via2 layer 306 are placed between the metal layers of RDL1 302 and RDL2 304, but the vias of the Via2 layer 306 do not continue in the vertical direction to make a physical connection with the metal layer of RDL3 502. Similarly, the vias of the Via3 layer 504 are placed between the metal layers of RDL2 304 and RDL3 502, but the vias of the Via3 layer 504 do not continue in the vertical direction to make a physical connection with the metal layer of RDL1 302. However, in other implementations, the DRCs permit the use of a through-hole via that is formed through three or more metal layers.

It is noted that in the above examples illustrated in FIGS. 3-5, the metal overlap regions are between metal layers of the RDL and have rectangular shapes. However, in other examples, the metal overlap regions are between a pin of the surface mount device (SMD) pin layer and a metal layer of the RDL. It is possible and contemplated that the metal overlap regions have a circular shape in these examples. In yet other examples, the metal overlap regions are between a metal layer of the RDL and an under-bump metallurgy (UBM) layer providing electrical connection to a C4 bump.

Turning to FIG. 6, a generalized block diagram of a graphical user interface (GUI) 600 is shown. As shown, the GUI 600 includes multiple selections for customizing multiple attributes used for automatic via generation in redistribution layers. The user is able to provide selections for the multiple attributes using one or more of a provided drop-down menu, an input box for receiving text, a checkbox or other shape that changes color to indicate a selection, and so forth. Box 602 allows the user to select a geographical area in the redistribution layers for automatic via generation. For example, the user is able to draw a shape with boundaries that define the area for automatic via generation. Alternatively, the user is able to select the preexisting design outline.

In some implementations, a table is provided with multiple fields. Field 604 indicates the adjacent layers to customize for automatic via generation. As shown, the first row indicates a metal layer RDL1 and the SMD pin layer. The Via1 layer is between these two layers (RDL1 and SMD pin). The second row indicates the metal layer RDL1 and the metal layer RDL2. The Via2 layer is between these two metal layers (RDL1 and RDL2). The third and fourth rows follow this same convention for identifying via layers. The last row indicates a metal layer (RDL4) and the UBM physically connected to C4 bumps. The Via5 layer is between these two layers (RDL4 and UBM). Field 606 indicates a via pad stack for each of the via layers. The via pad stack includes features describing a single via definition or a multiple via definition such as the metal layers on the ends of the via opening(s) in the dielectric. The pad stack definition also describes the hole (via opening) in the redistribution layers used for creating a via. These features include whether the hole is plated or unplated. Additionally, these features indicate a size (diameter) of the hole, the size of the finished hole, the size of the pads formed on the inner and outer layers, and the size of clearances around the hole. The user indicates the via pitch in field 608.

The field 610 describing the via placement includes three sub-fields. A first sub-field indicates the reference metal. For example, the Via2 layer is between the two metal layers RDL1 and RDL2. The user selects one of these metal layers RDL1 and RDL2 as the reference metal to use to describe the placement of vias in the metal overlap regions of the RDL1 and RDL2 layers. The user selects a starting point with the second sub-field. The starting point refers to the selected reference metal and also indicates an edge of the selected reference metal to being automatic via placement. As an example, and referring briefly again to metal layers 500 (of FIG. 5), for the Via2 layer, the user selects "Top" as the reference metal, which indicates the metal layer RDL2. The user selects "rail right edge" as the starting point, and the user selects "vertical" for the direction, which is the third sub-field. The vertical and horizontal directions are used to determine the placement of the pad stacks of the multiple vias that are placed in the metal overlap region. Examples of placing multiple vias in the metal overlap region are provided in FIGS. 3-5.

In various implementations, one of the sub-fields of field 610 or another field (not shown) of GUI 600 includes an indication that allows the user to specify the type of hole and corresponding type of via. For example, the user is able to specify whether the hole of the via is a hole of a through hole via, a hole of multiple holes of a stack of microvias, a hole of a blind microvia, a hole of a buried hole, or a hole of a copper filled microvia. In other implementations, the selection of the type of hole and corresponding type of via is not permitted by the user. Rather, the semiconductor fabrication process already defines the type of hole and corresponding type of via between metal layers of the RDL. This information is provided by another file that is accessed by the RDL automatic via generator when generating the vias based on the attributes provided by the user.

It is noted that in some implementations, a row of the table identifies one or more via layers that skips a metal layer. In one example, a row (not shown) indicates the metal layers RDL2 and RDL4. One or more vias are between these two metal layers (RDL2 and RDL4), but does not traverse through the metal layer RDL3. As described earlier, the type of hole and corresponding type of via between metal layers of the RDL are specified by the user or they are already specified by the semiconductor fabrication process. Another field or other indicator indicates that there is no metal layer RDL3 in these particular overlap regions. Therefore, only dielectric is present with no metal of the metal layer RDL3 between RDL2 and RDL4 in these particular overlap regions. In some implementations, one or more fields of the table of the GUI 600 includes a cross-section definition of the via layers identifying a thickness (depth) of the corresponding vias between corresponding metal layers. The pad stack definition provides the diameters of the vias as described earlier. Further, in some implementations, a field of the table of the GUI 600 indicates via stacking rules such as vias of the Via1 layer and the Via3 layer are allowed to be placed (stacked) in a same vertically aligned overlap region, whereas, vias of the Via2 layer are not permitted to be placed in this same vertically aligned overlap region.

Field 620 indicates the sequence order to use for the automatic via generation in the redistribution layers. It is unnecessary to traverse the via layers in a continuous adjacent manner. The user is able to customize the order of the via layers that the automatic via generator uses. It is noted that in some cases, the automatic via generator defaults to using a maximum number of vias of the Via1 layer to fit inside of an area of a pin of the SMD pin layer while still satisfying a DRC using the pitch of the Via1 layer. In various implementations, the pins of the SMD pin layer are significantly larger than the vias of the Via1 layer.

It is also noted that one or more via layers (one or more rows in the table) have multiple sequence numbers indicating that a reiteration occurs for a particular via layer. For example, referring briefly again to metal layers 400-500 (of FIG. 4 and FIG. 5), a first pass of the Via2 layer adds only a single column of vias of the Via2 layer on the right edge of the vertical metal layer RDL2. For portions of the redistribution layer that also have a metal layer RDL3 overlapping a metal layer RDL1 as shown in metal layers 500, the placement of the vias of the Via2 layer has completed. However, for portions of the redistribution layer that do not have a metal layer RDL3 overlapping a metal layer RDL1 as shown in metal layers 400, it is possible to add more vias of the Via2 layer.

Field 630 allows the user to indicate whether to allow DRC violations. For example, the user wishes to stagger the vias of two different layers such as vias of the Via1 layer and the Via3 layer. Therefore, more vias fit within a particular area while still satisfying DRC spacing at a same via layer. Field 630 also allows the user to indicate whether a report is to be generated providing result information of the automatic via generation using the attributes provided in the multiple fields of the GUI 600.

Referring now to FIG. 7, one embodiment of a method 700 for automatic via generation in redistribution layers is shown. For purposes of discussion, the steps in this embodiment (as well as for FIG. 8) are shown in sequential order. However, in other embodiments, some steps occur in a different order than shown, some steps are performed concurrently, some steps are combined with other steps, and some steps are absent.

A user selects attributes to customize automatic via generation in redistribution layers (block 702). In one implementation, the user provides the attributes to an automatic via generator through the graphical user interface (GUI). The GUI 600 (of FIG. 6) is one example. In another implementation, the user provides the attributes to the automatic via generator through a text file or an executable file written in one of a variety of scripting languages. The user initiates execution of the automatic via generator and a processor of a corresponding computing device performs automatic via generation in the redistribution layers based on the attributes (block 704). In one implementation, this automatic generation includes receiving attributes such as reference metal identification, a starting point, a direction, and a sequence. Additionally, an overlap region is identified as discussed above. Based on this information, data indicative of placement of one or more vias between metal layers is generated. In addition, attributes may include pitch and size information for a given layer that is used to determine spacing between vias. Further, as discussed above, in an implementation, the automatic process is configured to divide the overlap region in half and place vias both above and below the overlap region. Subsequently, the user executes one or more tools to perform design rule check (DRC) verification and layout versus schematic (LVS) verification (block 706).

The user determines whether the results of the automatic via generation satisfy design requirements such as a measure of via redundancy and a measure of equivalent via resistance in a particular area of the redistribution layers. If the results do not satisfy design requirements ("no" branch of the conditional block 708), then control flow of method 700 returns to block 702 where the user selects attributes. If the results satisfy design requirements ("yes" branch of the conditional block 708), then the design of the semiconductor package is taped out and fabricated (block 710).

If an electric potential is not applied to a first node of an integrated circuit in the semiconductor package ("no" branch of the conditional block 712), then the semiconductor package waits for power up (block 714). However, if a potential is applied to the first node created a potential difference ("yes" branch of the conditional block 710), then metal layers and vias that were automatically generated in the redistribution layers conveys a current between the integrated circuit and the motherboard (block 716).

Turning to FIG. 8, one embodiment of a method 800 for automatic via generation in redistribution layers is shown. A user defines attributes for an automatic via generator to use for automatic via generation in redistribution layers. In one implementation, the user provides the attributes to the automatic via generator through the graphical user interface (GUI). The GUI 600 (of FIG. 6). In another implementation, the user provides the attributes to the automatic via generator through a text file or an executable file written in one of a variety of scripting languages. When a processor executes the instructions of the automatic via generator, the processor define pads at far ends of the redistribution layers (block 802). For example, the user defines a pitch to use inside pads. In one example, the user defines a pitch of vias of the Via1 layer to connect to pins of the SMD pin layer. The user selects the pitch to both satisfy preexisting DRC rules and to maximize the number of vias of the Via1 layer making physical connection to a corresponding pin of the SMD pin layer. Based on attributes input by the user, the processor defines the pins of the SMD pins layer at the top of the stack of redistribution layers and defines the vias of the Via5 layer at the bottom of the stack of the redistribution layers, where the top and bottom are indication of orientation The processor calculates the metal overlap regions (block 804). Examples of metal overlap regions between the metal layers RDL1 and RDL2 are shown in metal layers 300-500 (of FIGS. 3-5). Examples of metal overlap regions between the metal layers RDL2 and RDL3 are shown in metal layers 500 (of FIG. 5). In other examples, the processor calculates metal overlap regions between a pin of the SMD pin layer and a metal layer of the RDL. In yet other examples, the processor calculates metal overlap regions between a metal layer of the RDL and an under-bump metallurgy (UBM) layer providing electrical connection to a C4 bump. The shapes of the metal overlap regions are squares, rectangles, or circles based on the upper and lower layers used to define the metal overlap regions. In some implementations, based on received attributes, the processor divides an overlap region in half to allow via layers to be placed both above and below the overlap region. An example of this type of via placement is shown in metal layers 500 (of FIG. 5). Based on attributes that indicate a reference metal, a starting point and a direction, the processor places vias of different via layer types (e.g., Via2, Via3) in the overlap region. In some implementations, if top (above) vias have already taken a place in the divided region, the bottom (below) vias are placed in the other half. If the two adjacent layers overlapping regions are not in the same location, the overlap region is fully utilized for bottom vias and vice versa (example, RDL1 and RDL3 are not in the same plane). Such an approach may be used in cases where DRC constraints do not permit stacking of vias.

The processor generates the vias based on an indicated sequence (block 806). The indicated sequence is specified in the received attributes from the user. The sequence order determines which via layer to use to initiate the automatic via generation and each subsequent via layer to select for further automatic via generation. The vias are placed based on the size and pitch corresponding to the currently selected via layer so as to satisfy DRC rules. In addition, the processor does not change the dimensions of the metal layers of signal routes. If multiple sequences for certain via layers are specified in the received attributes, the processor places additional vias in the via layers where possible. Although in some cases via redundancy already exists, the automatic via generator still increases the via count where possible. The processor generates a report (block 808). The processor maintains a log file during the automatic via generation and uses the corresponding information to provide summarized results in the report. In various implementations, the processor writes a file located in a known destination.

Referring to FIG. 9, one implementation of a computing system 900 is shown that utilizes redistribution layers with automatically placed vias. The computing system 900 utilizes a chip package 940, which includes the automatically generated vias in the redistribution layers. The chip package 940 uses one of a ball grid array (BGA) surface mount package, a chip scale package (CSP), and a System in Package (SiP) that communicates with other components on a motherboard (or printed circuit board). In an implementation, the computing system 900 includes the processor 910 and the memory 930 in the chip package 940. In another implementation, only one of the processor 910 and the memory 930 is included in the chip package 940. Interfaces, such as a memory controller, a bus or a communication fabric, one or more phased locked loops (PLLs) and other clock generation circuitry, a power management unit, and so forth, are not shown for ease of illustration. Additionally, in the illustrated implementation, the chip package 940 is connected to the disk memory 954 through the memory bus 950 and the input/output (I/O) controller and bus 952.

It is understood that in other implementations, the computing system 900 includes one or more of other processors of a same type or a different type than processor 910, one or more peripheral devices, a network interface, one or more other memory devices, and so forth. In some implementations, the functionality of the computing system 900 is incorporated on a system on chip (SoC). In other implementations, the functionality of the computing system 900 is incorporated on a peripheral card inserted in a motherboard. The computing system 900 is used in any of a variety of computing devices such as a desktop computer, a tablet computer, a laptop, a smartphone, a smartwatch, a gaming console, a personal assistant device, and so forth.

The processor 910 includes hardware such as circuitry. In various implementations, the processor 910 includes one or more processing units. In some implementations, each of the processing units includes one or more processor cores capable of general-purpose data processing, and an associated cache memory subsystem. In such an implementation, the processor 910 is a central processing unit (CPU). In another implementation, the processing cores are compute units, each with a highly parallel data microarchitecture with multiple parallel execution lanes and an associated data storage buffer. In such an implementation, the processor 910 is a graphics processing unit (GPU), a digital signal processor (DSP), or other.

In some implementations, the memory 930 includes one of a variety of types of dynamic random access memories (DRAMs). The memory 930 stores at least a portion of an operating system (OS) 932, one or more applications represented by code 934, and at least source data 936. In various implementations, the memory 930 stores a copy of these software components 932, 934 and 936 that have original copies stored on disk memory 954. Memory 930 is also capable of storing intermediate result data and final result data generated by the processor 910 when executing a particular application of code 934.

In various implementations, the off-chip disk memory 954 includes one or more hard disk drives (HDDs) and Solid-State Disks (SSDs) comprising banks of Flash memory. The I/O controller and bus 952 supports communication protocols with the off-chip disk memory 954. Although a single operating system 932 and a single instance of code 934 and source data 936 are shown, in other implementations, another number of these software components are stored in memory 930 and disk memory 954. The operating system 932 includes instructions for initiating the boot up of the processor 910, assigning tasks to hardware circuitry, managing resources of the computing system 900 and hosting one or more virtual environments.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor comprising:
   circuitry configured to:
   receive a plurality of attributes corresponding to placement of a plurality of vias between adjacent metal layers of a plurality of metal layers; and
   generate data indicative of a placement of the plurality of vias in via layers between the adjacent metal layers, based at least in part on the attributes and an identification of an overlap region in the adjacent metal layers, wherein the attributes identify a first via layer is to have vias generated both prior to and after generation of vias of a second via layer.

2. The processor as recited in claim 1, wherein the attributes further comprise one or more of a reference metal identification, a starting point, and a direction.

3. The processor as recited in claim 2, wherein the circuitry is further configured to determine a placement of the vias based at least in part on a size and pitch of a currently selected via layer.

4. The processor as recited in claim 3, wherein the circuitry is further configured to determine a spacing between multiple vias placed in the overlap region, based at least in part on the size and pitch.

5. The processor as recited in claim 1, wherein the circuitry is further configured to divide the overlap region in half and place vias both above and below the overlap region.

6. The processor as recited in claim 1, wherein the circuitry is further configured to generate a placement of the vias of the first via layer generated after generation of vias of the second via layer in a manner based on placement of the vias of the second via layer.

7. The processor as recited in claim 1, wherein the plurality of metal layers are redistribution layers between an integrated circuit and a printed circuit board.

8. A method comprising:
   receiving a plurality of attributes corresponding to placement of a plurality of vias between adjacent metal layers of a plurality of metal layers; and
   generating data indicative of a placement of the plurality of vias in via layers between the adjacent metal layers, based at least in part on the attributes and an identification of an overlap region in the adjacent metal layers, wherein the attributes identify a first via layer is to have vias generated both prior to and after generation of vias of a second via layer.

9. The method as recited in claim 8, wherein the attributes further comprise one or more of a reference metal identification, a starting point, a direction.

10. The method as recited in claim 9, further comprising, determining a placement of the vias based at least in part on a size and pitch of a currently selected via layer.

11. The method as recited in claim 8, further comprising generating a placement of the vias of the first via layer generated after generation of vias of the second via layer in a manner based on placement of the vias of the second via layer.

12. The method as recited in claim 11, wherein the plurality of metal layers are redistribution layers between an integrated circuit and a printed circuit board.

13. The method as recited in claim 11, wherein one or more signal types conducted by the plurality of metal layers comprise one or more of a power supply voltage reference level or a ground reference voltage level used by an integrated circuit.

14. The method as recited in claim 11, further comprising receiving the plurality of attributes via a graphical user interface.

15. A non-transitory storage medium configured to store program instruction, wherein program instructions are executable by circuitry to:
  receive data comprising a plurality of attributes corresponding to placement of a plurality of vias between adjacent metal layers of a plurality of metal layers; and
  generate data indicative of a placement of the plurality of vias in via layers between the adjacent metal layers, based at least in part on the attributes and an identification of an overlap region in the adjacent metal layers, wherein the attributes identify a first via layer is to have vias generated both prior to and after generation of vias of a second via layer.

16. The non-transitory storage medium as recited in claim 15, wherein the attributes further comprise one or more of a reference metal identification, a starting point, a direction.

17. The non-transitory storage medium as recited in claim 16, wherein the program instructions are further executable by circuitry to determine a placement of the vias based at least in part on a size and pitch of a currently selected via layer.

18. The non-transitory storage medium as recited in claim 17, wherein the program instructions are further executable by circuitry to determine a spacing between multiple vias placed in the overlap region, based at least in part on the size and pitch.

19. The non-transitory storage medium as recited in claim 15, wherein the program instructions are further executable by circuitry to divide the overlap region in half and place vias both above and below the overlap region.

20. The non-transitory storage medium as recited in claim 15, wherein the program instructions are executable by circuitry to generate a placement of the vias of the first via layer generated after generation of vias of the second via layer in a manner based on placement of the vias of the second via layer.

* * * * *